United States Patent
Chan et al.

(10) Patent No.: US 8,767,907 B2
(45) Date of Patent: Jul. 1, 2014

(54) SHIFT REGISTER

(71) Applicant: AU Optronics Corp., Hsin-Chu (TW)

(72) Inventors: Pin-Yu Chan, Hsin-Chu (TW);
Yu-Chung Yang, Hsin-Chu (TW);
Yung-Chih Chen, Hsin-Chu (TW);
Ming-Yen Tsai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 48 days.

(21) Appl. No.: 13/726,555

(22) Filed: Dec. 25, 2012

(65) Prior Publication Data
US 2014/0105351 A1 Apr. 17, 2014

(30) Foreign Application Priority Data
Oct. 12, 2012 (TW) .............................. 101137809 A

(51) Int. Cl.
*G11C 19/00* (2006.01)
(52) U.S. Cl.
USPC .................................. 377/64; 377/78; 377/79
(58) Field of Classification Search
CPC ........................ G11G 19/28; G09G 2310/0286
USPC .................................... 377/64, 68, 69, 77–80
See application file for complete search history.

(56) References Cited

U.S. PATENT DOCUMENTS

| 8,040,293 B2 * | 10/2011 | Jeong ............................... 345/46 |
| 2008/0088564 A1 * | 4/2008 | Chang et al. ..................... 345/99 |
| 2011/0241729 A1 * | 10/2011 | Yamamoto et al. ........... 326/112 |
| 2011/0242079 A1 * | 10/2011 | Yamamoto et al. ........... 345/211 |
| 2011/0293063 A1 * | 12/2011 | Tsai et al. ....................... 377/79 |
| 2012/0140871 A1 * | 6/2012 | Yang et al. ...................... 377/79 |
| 2012/0155604 A1 * | 6/2012 | Yang et al. ...................... 377/79 |
| 2012/0169581 A1 * | 7/2012 | Su et al. ......................... 345/100 |
| 2012/0219105 A1 * | 8/2012 | Lin et al. ........................ 377/79 |
| 2012/0250816 A1 * | 10/2012 | Tsai et al. ....................... 377/77 |

* cited by examiner

*Primary Examiner* — Tuan T Lam
(74) *Attorney, Agent, or Firm* — Winston Hsu; Scott Margo

(57) ABSTRACT

A shift register includes a plurality of shift register circuits, where an Nth shift register circuit of the shift register includes a driving unit, a boost unit, a pull up unit, and a key pull down unit. The driving unit is for providing a gate signal, a first boost control signal, and a first transmission control signal according a first driving signal and a high frequency clock signal. The boost unit is for boosting the voltage of the first driving signal according to a first boost signal. The pull up unit is for providing a second driving signal according to the first transmission control signal and the gate signal, and is for providing a second boost signal according to the first boost control signal and a second boost control signal. The key pull down unit is for pulling down the first driving signal according to a second transmission control signal.

21 Claims, 7 Drawing Sheets

SHIFT REGISTER

BACKGROUND OF THE DISCLOSURE

1. Technical Field

The present disclosure is related to a shift register circuit, and more particularly, to a shift register circuit having high driving ability.

2. Description of the Prior Art

Please refer to FIG. 1, which is diagram illustrating a prior art liquid crystal display (LCD) 100 having a shift register 102 and a pixel array 104. The shift register 102 includes a plurality of shift register circuits 106 for providing a plurality of gate signals transmitted to the pixel array 104 through a plurality of gate lines 108 in order to scan pixels in the pixel array 104. As the size of LCDs increases with time, the resolution of LCDs, that is, the number of pixels also increases, thereby increasing the number of gate lines 108 required to scan the pixel array 104. In order to scan more and more pixels at a limited frame rate, for example 60 Hz, the scanning speed of each gate line 108 must increase within a frame period, in other words, the scanning time of each gate line 108 must be reduced so as to scan all pixels completely within the frame period. However, with the reduction of the scanning time, the charging rate of pixels may decrease to a level which may result in poorer display quality.

Although a method for boosting voltage levels of the gate signals to alleviate the problem as set forth has been provided, the method may increase the dynamic power consumption and the static power consumption of the shift register circuits 106, thereby requiring bigger size transistors to be used in the shift register circuits 106 that occupy more layout area in the LCD, which contradicts the goal of minimizing layout area of the shift register circuits 106.

SUMMARY OF THE DISCLOSURE

An embodiment of the present disclosure discloses a shift register. The shift register includes a plurality of shift register circuits. An Nth shift register circuit comprises a driving unit, a boost unit, a pull up unit, and a key pull down unit. The driving unit provides a gate signal, a first boost control signal, and a first transmission control signal according a first driving signal and a high frequency clock signal. The boost unit is coupled to the driving unit and boosts the first driving signal voltage according to a first boost signal. The pull up unit is coupled to the driving unit for providing a second driving signal according to the first transmission control signal and the gate signal, and for providing a second boost signal according to the first boost control signal and a second boost control signal. The key pull down unit is coupled to the driving unit for pulling down the first driving signal according to a second transmission control signal.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
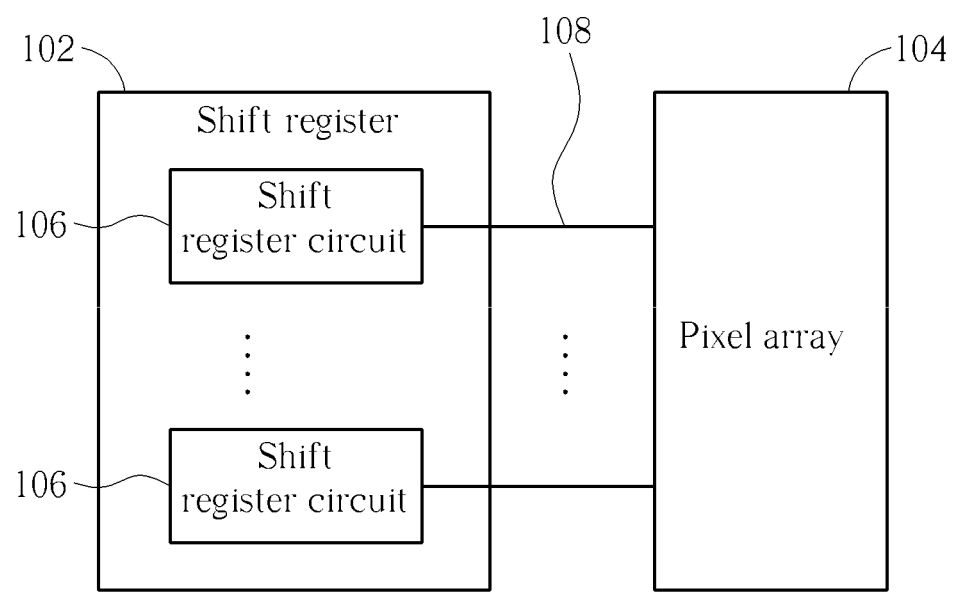
FIG. 1 is diagram illustrating a prior art liquid crystal display (LCD) having a shift register and a pixel array.
Figure 2:
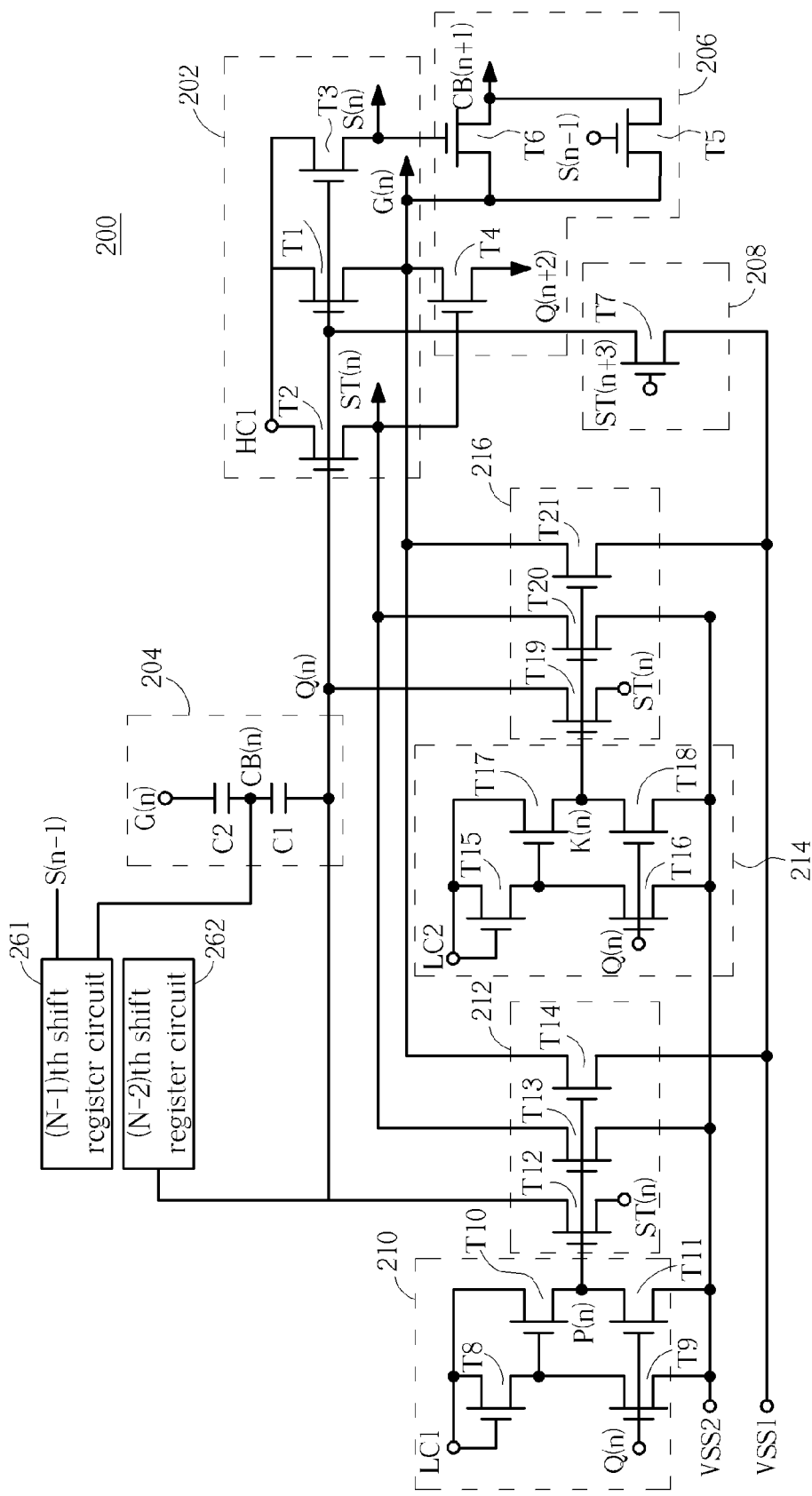
FIG. 2 is a diagram illustrating an Nth shift register circuit of a plurality of shift register circuits in a shift register according to an embodiment of the present disclosure.

Please refer to FIG. 2, which is a diagram illustrating an Nth shift register circuit 200 of a plurality of shift register circuits in a shift register according to an embodiment of the present disclosure. The Nth shift register circuit 200 may include a driving unit 202, a boost unit 204, a pull up unit 206, a key pull down unit 208, a first pull down control unit 210, a first pull down unit 212, a second pull down control unit 214, and a second pull down unit 216. FIG. 2 also shows an (N−1)th shift register circuit 261 and an (N−2)th shift register circuit 262 for illustration purposes.

The driving unit 202 is for providing a gate signal, a first transmission control signal, and a first boost control signal according a first driving signal and a first high frequency clock signal HC1. The first driving signal may be an Nth driving signal Q(n) of the Nth shift register circuit 200 outputted from the (N−2)th shift register circuit 262. The gate signal may be an Nth gate signal G(n). The first transmission control signal may be an Nth transmission control signal ST(n). The first boost control signal may be an Nth boost control signal S(n). The boost unit 204 is coupled to the driving unit 202 for boosting the Nth driving signal Q(n) voltage according to a first boost signal. The first boost signal may be an Nth boost signal CB(n) of the Nth shift register circuit 200 outputted from the (N−1)th shift register circuit 261. The pull up unit 206 is coupled to the driving unit 202 for providing a second driving signal according to the Nth transmission control signal ST(n) and the Nth gate signal G(n), and for providing a second boost signal according to the Nth boost control signal S(n) and a second boost control signal. The second driving signal may be an (N+2)th driving signal Q(n+2) of an (N+2)th shift register circuit outputted from the Nth shift register circuit 200. The second boost control signal may be an (N−1)th boost control signal S(n−1) of the (N−1)th shift register circuit 261. The second boost signal may be an (N+1)th boost signal CB(n+1) of the (N+1)th shift register circuit outputted from the Nth shift register circuit 200. The key pull down unit 208 is coupled to the driving unit 202 for pulling down the Nth driving signal Q(n) according to a second transmission control signal. The second transmission control signal may be an (N+3)th transmission control signal of an (N+3)th shift register circuit. The first pull down control unit 210 is for providing a first pull down signal P(n) according to the Nth driving signal Q(n) and a first low frequency clock signal LC1. The first pull down unit 212 is coupled to the first pull down control unit 210 and the driving unit 202 for pulling down the Nth gate signal G(n), the Nth transmission control signal ST(n), and the Nth driving signal Q(n) according to the first pull down signal P(n). The second pull down control unit 214 is for providing a second pull down signal K(n) according to the Nth driving signal Q(n) and a second low frequency clock signal LC2. The second pull down unit 216 is coupled to the second pull down control unit 214 and the driving unit 202 for pulling down the Nth gate signal G(n), the Nth transmission control signal ST(n), and the Nth driving signal Q(n) according to the second pull down signal K(n). Due to the first low frequency clock signal LC1 being out of phase with the second low frequency clock signal LC2, the second pull down control unit 214 stops operating when the first pull down control unit 210 outputs the first pull down signal P(n), and vice versa, when the second pull down control unit 214 outputs the second pull down signal K(n), the first pull down control unit 210 stops operating. This kind of alternating operations can increase durability of transistors in the Nth shift register circuit 200.

The driving unit 202 may include a first transistor T1, a second transistor T2, and a third transistor T3. The first transistor T1 has a control end for receiving the Nth driving signal Q(n) outputted from the (N−2)th shift register circuit 262, a first end for receiving the first high frequency clock signal HC1, and a second end for providing the Nth gate signal G(n). The second transistor T2 has a control end coupled to the control end of the first transistor T1, a first end coupled to the first end of the first transistor T1, and a second end for providing the Nth transmission control signal ST(n). The third transistor T3 has a control end coupled to the control end of the first transistor T1, a first end coupled to the first end of the first transistor T1, and a second end for providing the Nth boost control signal S(n).

The boost unit 204 may include a first capacitor C1. The first capacitor C1 has a first end for receiving the Nth boost signal CB(n) outputted from the (N−1)th shift register circuit 261, and a second end coupled to the control end of the first transistor T1. The boost unit 204 may further include a second capacitor C2. The second capacitor C2 is coupled between the second end of the first transistor T1 and the first end of the first capacitor C1 for receiving the Nth gate signal G(n) and, in conjunction with the first capacitor C1, for stabilizing voltage between the control end of the first transistor T1 and the second end of the first transistor T1.

The pull up unit 206 may include a fourth transistor T4, a fifth transistor T5, and a sixth transistor T6. The fourth transistor T4 has a control end coupled to the second end of the second transistor T2, a first end coupled to the second end of the first transistor T1, and a second end for providing the (N+2)th driving signal Q(n+2). The fifth transistor T5 has a control end for receiving the (N−1)th boost control signal S(n−1), a first end coupled to the second end of the first transistor T1, and a second end. The sixth transistor T6 has a control end coupled to the second end of the third transistor T3, a first end coupled to the second end of the first transistor T1, and a second end coupled to the second end of the fifth transistor T5 for providing the (N+1)th boost signal CB(n+1).

The key pull down unit 208 may include a seventh transistor T7. The seventh transistor T7 has a control end for receiving the (N+3)th transmission control signal ST(n+3), a first end coupled to the control end of the first transistor T1, and a second end for receiving a first reference voltage VSS1. A voltage level of the first reference voltage VSS1 may be higher than that of a second reference voltage VSS2.

The first pull down control unit 210 may include an eighth transistor T8, a ninth transistor T9, a tenth transistor T10, and an eleventh transistor T11. The first pull down unit 212 may include a twelfth transistor T12, a thirteenth transistor T13, and a fourteenth transistor T14. The eighth transistor T8 has a control end for receiving the first low frequency clock signal LC1, a first end coupled to the control end of the eighth transistor T8, and a second end. The ninth transistor T9 has a control end for receiving the Nth driving signal Q(n), a first end coupled to the second end of the eighth transistor T8, and a second end for receiving the second reference voltage VSS2. The tenth transistor T10 has a control end coupled to the second end of the eighth transistor T8, a first end coupled to the control end of the eighth transistor T8, and a second end for providing the first pull down signal P(n). The eleventh transistor T11 has a control end coupled to the control end of the ninth transistor T9, a first end coupled to the second end of the tenth transistor T10, and a second end coupled to the second end of the ninth transistor T9. The twelfth transistor T12 has a control end coupled to the second end of the tenth transistor T10, a first end coupled to the control end of the second transistor T2, and a second end coupled to the second end of the second transistor T2. The thirteenth transistor T13 has a control end coupled to the control end of the twelfth transistor T12, a first end coupled to the second end of the second transistor T2, and a second end coupled to the second end of the ninth transistor T9. The fourteenth transistor T14 has a control end coupled to the control end of the twelfth transistor T12, a first end coupled to the second end of the first transistor T1, and a second end coupled to the second end of the seventh transistor T7.

The second pull down control unit 214 may include a fifteenth transistor T15, a sixteenth transistor T16, a seventeenth transistor T17, and an eighteenth transistor T18. The second pull down unit 216 may include a nineteenth transistor T19, a twentieth transistor T20, and a twenty-first transistor T21. The fifteenth transistor T15 has a control end for receiving the second low frequency clock signal LC2, a first end coupled to the control end of the fifteenth transistor T15, and a second end. The sixteenth transistor T16 has a control end for receiving the Nth driving signal Q(n), a first end coupled to the second end of the fifteenth transistor T15, and a second end coupled to the second end of the ninth transistor T9. The seventeenth transistor T17 has a control end coupled to the second end of the fifteenth transistor T15, a first end coupled to the control end of the fifteenth transistor T15, and a second end for providing the second pull down signal K(n). The eighteenth transistor T18 has a control end coupled to the control end of the sixteenth transistor T16, a first end coupled to the second end of the seventeenth transistor T17, and a second end coupled to the second end of the sixteenth transistor T16. The nineteenth transistor T19 has a control end coupled to the second end of the seventeenth transistor T17, a first end coupled to the control end of the second transistor T2, and a second end coupled to the second end of the second transistor T2. The twentieth transistor T20 has a control end coupled to the control end of the nineteenth transistor T19, a first end coupled to the second end of the second transistor T2, and a second end coupled to the second end of the sixteenth transistor T16. The twenty-first transistor T21 has a control end coupled to the control end of the nineteenth transistor T19, a first end coupled to the second end of the first transistor T1, and a second end coupled to the second end of the seventh transistor T7.

Figure 3:
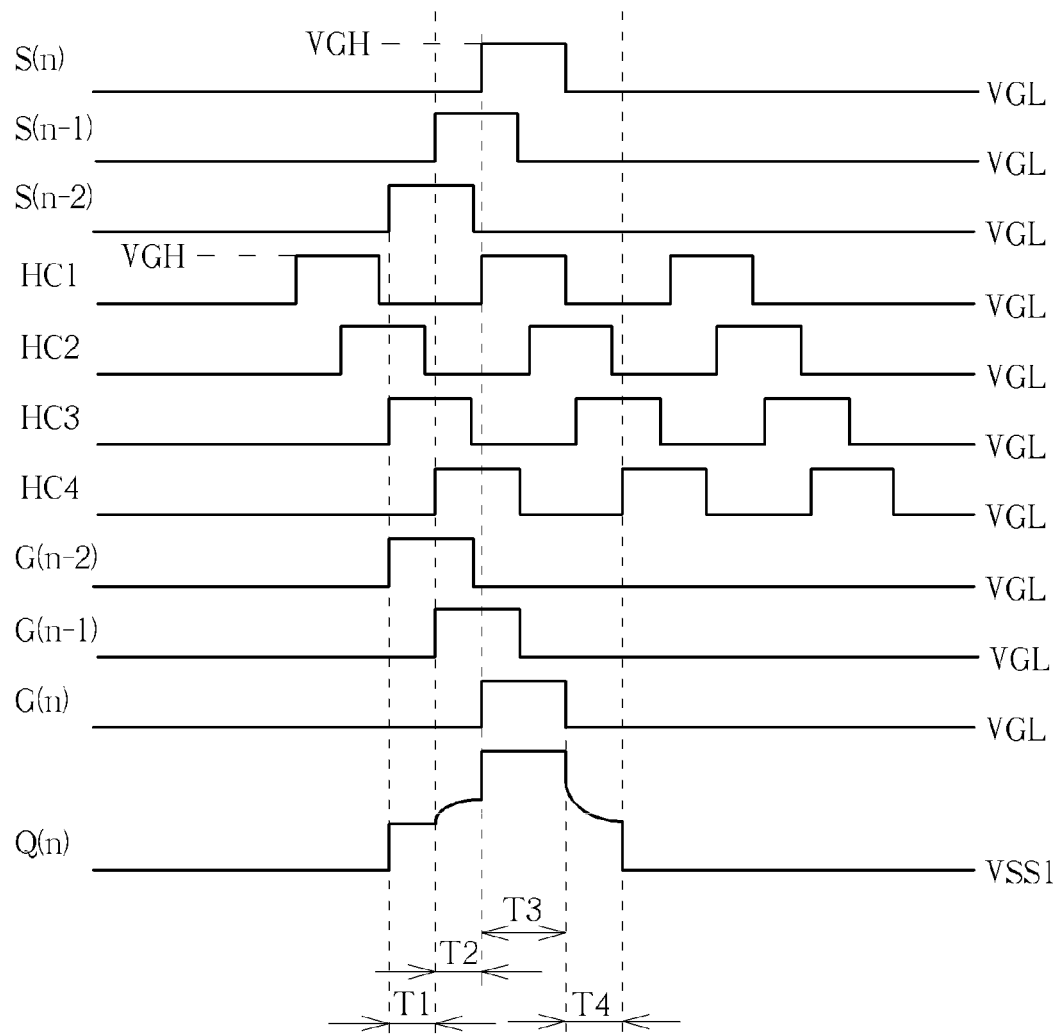
FIG. 3 is a waveform diagram illustrating signals of the Nth shift register circuit of FIG. 2 according to an embodiment of the present disclosure.

Please refer to FIG. 2 and FIG. 3. FIG. 3 is a waveform diagram illustrating signals of the Nth shift register circuit 200 of FIG. 2 according to an embodiment of the present disclosure. The abscissa axis of FIG. 3 is time t. From top to bottom of FIG. 3 are the Nth boost control signal S(n), the (N−1)th boost control signal S(n−1), an (N−2)th boost control signal S(n−2), the first high frequency clock signal HC1, a second high frequency clock signal HC2, a third high frequency clock signal HC3, a fourth high frequency clock signal HC4, an (N−2)th gate signal G(n−2), an (N−1)th gate signal G(n−1), the Nth gate signal G(n), and the Nth driving signal Q(n). The first high frequency clock signal HC1, the second high frequency clock signal HC2, the third high frequency clock signal HC3, and the fourth high frequency clock signal HC4 are either at a high voltage VGH or at a low voltage VGL, and frequencies thereof are higher than that of the first low frequency clock signal LC1 and the second low frequency clock signal LC2. The first high frequency clock signal HC1, the second high frequency clock signal HC2, the third high frequency clock signal HC3, and the fourth high frequency clock signal HC4 are timing signals sequentially and repeatedly applied to consecutive shift register circuits. For example, the (N−2)th shift register circuit may receive the third high frequency clock signal HC3, the (N−1)th shift register circuit may receive the fourth high frequency clock signal HC4, the Nth shift register circuit may receive the first high frequency clock signal HC1, the (N+1)th shift register circuit may receive the second high frequency clock signal HC2, the (N+3)th shift register circuit may receive the fourth high frequency clock signal HC4, and so on. The first reference voltage VSS1 may be the low voltage VGL. The first reference voltage VSS1 may be higher than the second reference voltage VSS2. Waveforms of the Nth transmission control signal ST(n), the Nth gate signal G(n), and the Nth boost control signal S(n) are identical. Waveforms of the (N−1)th transmission control signal ST(n−1), the (N−1)th gate signal G(n−1), and the (N−1)th boost control signal S(n−1) are identical. Waveforms of the (N−2)th transmission control signal ST(n−2), the (N−2)th gate signal G(n−2), and the (N−2)th boost control signal S(n−2) are identical. Waveforms of the (N+3)th transmission control signal ST(n+3), the (N+3)th gate signal G(n+3) are identical and both of them switch from the low voltage VGL to the high voltage VGH as the fourth high frequency clock signal HC4 changes when T4 period ends.

During T1 period of FIG. 3, the (N−1)th gate signal G(n−1) and the (N−1)th boost control signal S(n−1) are at the low voltage VGL, and the (N−2)th boost control signal S(n−2), the (N−2)th transmission control signal ST(n−2), and the (N−2)th gate signal G(n−2) switch from the low voltage VGL to the high voltage VGH as the third high frequency clock signal HC3 changes and may remain the same voltage during a portion of T2 period. During T1 period, the Nth boost signal CB(n) outputted from the (N−1)th shift register circuit 261 furnishes the low voltage VGL to the first end of the first capacitor C1 and the (N−2)th gate signal G(n−2) of the (N−2)th shift register circuit 262 charges the first capacitor C1 through the second end of the first capacitor C1, thereby pulling up the Nth driving signal Q(n) from the first reference voltage VSS1 to a first voltage V1 and conducting the first transistor T1, the second transistor T2, and the third transistor T3.

During T2 period, the (N−1)th gate signal G(n−1) and the (N−1)th boost control signal S(n−1) switch from the low voltage VGL to the high voltage VGH as the fourth high frequency clock signal HC4 changes and may remain the same voltage during a portion of T3 period. During T2 period, the Nth boost signal CB(n) outputted from the (N−1)th shift register circuit 261 furnishes the high voltage VGH of the (N−1)th gate signal of the (N−1)th shift register circuit 261 to the first end of the first capacitor C1, thereby pulling up the Nth driving signal Q(n) from the first voltage V1 to a second voltage V2 by utilizing a capacitor coupling effect. The (N−2)th boost control signal S(n−2), the (N−2)th transmission control signal ST(n−2), and the (N−2)th gate signal G(n−2) may switch from the high voltage VGH to the low voltage VGL before T2 period ends.

During T3 period, the first high frequency clock signal HC1 switches from the low voltage VGL to the high voltage VGH and pulls up the Nth gate signal G(n), the Nth transmission control signal ST(n), and the Nth boost control signal S(n) to the high voltage VGH through the first transistor T1, the second transistor T2, and the third transistor T3 respectively, thereby pulling up the Nth driving signal Q(n) from the second voltage V2 to a third voltage V3 by utilizing the capacitor coupling effect. In another embodiment, the second capacitor C2 may be removed and a third capacitor C3 may be disposed between the control end and the second end of the first transistor T1. The capacitor coupling effect of the third capacitor C1 may also pull up the Nth driving signal Q(n) from the second voltage V2 to the third voltage V3. The (N−1)th gate signal G(n−1) and the (N−1)th boost control signal S(n−1) may switch from the high voltage VGH to the low voltage VGL before T3 period ends.

When T3 period ends and T4 period begins, the first high frequency clock signal HC1 is switched from the high voltage VGH to the low voltage VGL, pulling down the Nth gate signal G(n), the Nth transmission control signal ST(n), and the Nth boost control signal S(n) to the low voltage VGL. The Nth driving signal Q(n) is pulled down from the third voltage V3 to a fourth voltage V4 by the same capacitor coupling effect as in T3 period. The fourth voltage V4 may be higher than the first voltage V1.

When T4 period ends, the fourth high frequency clock signal HC4 is switched from the low voltage VGL to the high voltage VGH, pulling up the (N+3)th transmission control signal ST(n+3) for conducting the seventh transistor T7 to pull down the Nth driving signal Q(n) to the first reference voltage VSS1.

Figure 4:
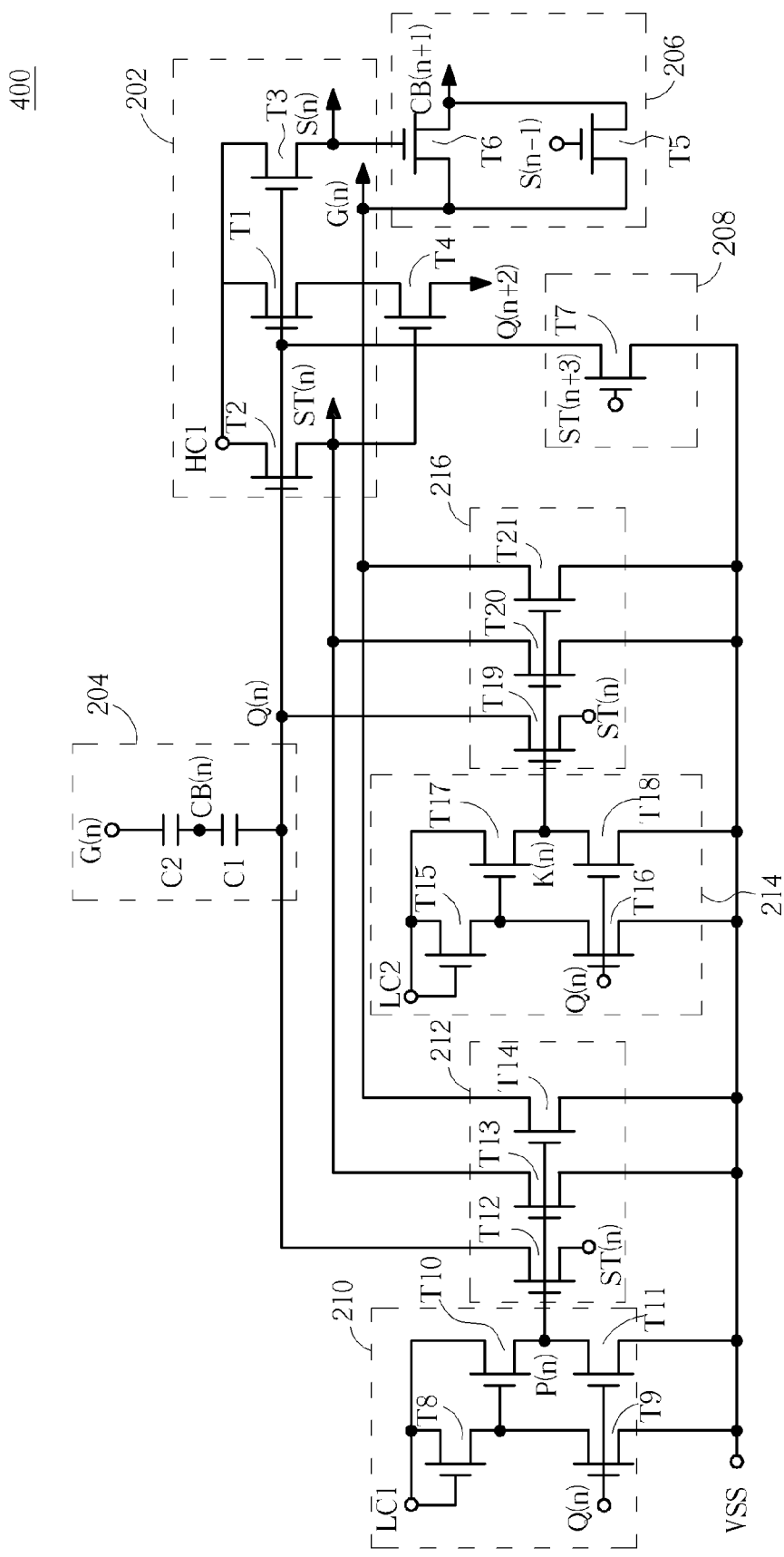
FIG. 4 is a diagram illustrating an Nth shift register circuit according another embodiment of the present disclosure.

Please refer to FIG. 4, which is a diagram illustrating an Nth shift register circuit 400 according another embodiment of the present disclosure. The first reference voltage VSS1 and the second reference voltage VSS2 of the Nth shift register circuit 400 are coupled to a same reference voltage VSS, which is different from FIG. 2. Other parts of the Nth shift register circuit 400 are identical to FIG. 2 and principles of FIG. 3 may be applied to FIG. 4.

Figure 5:
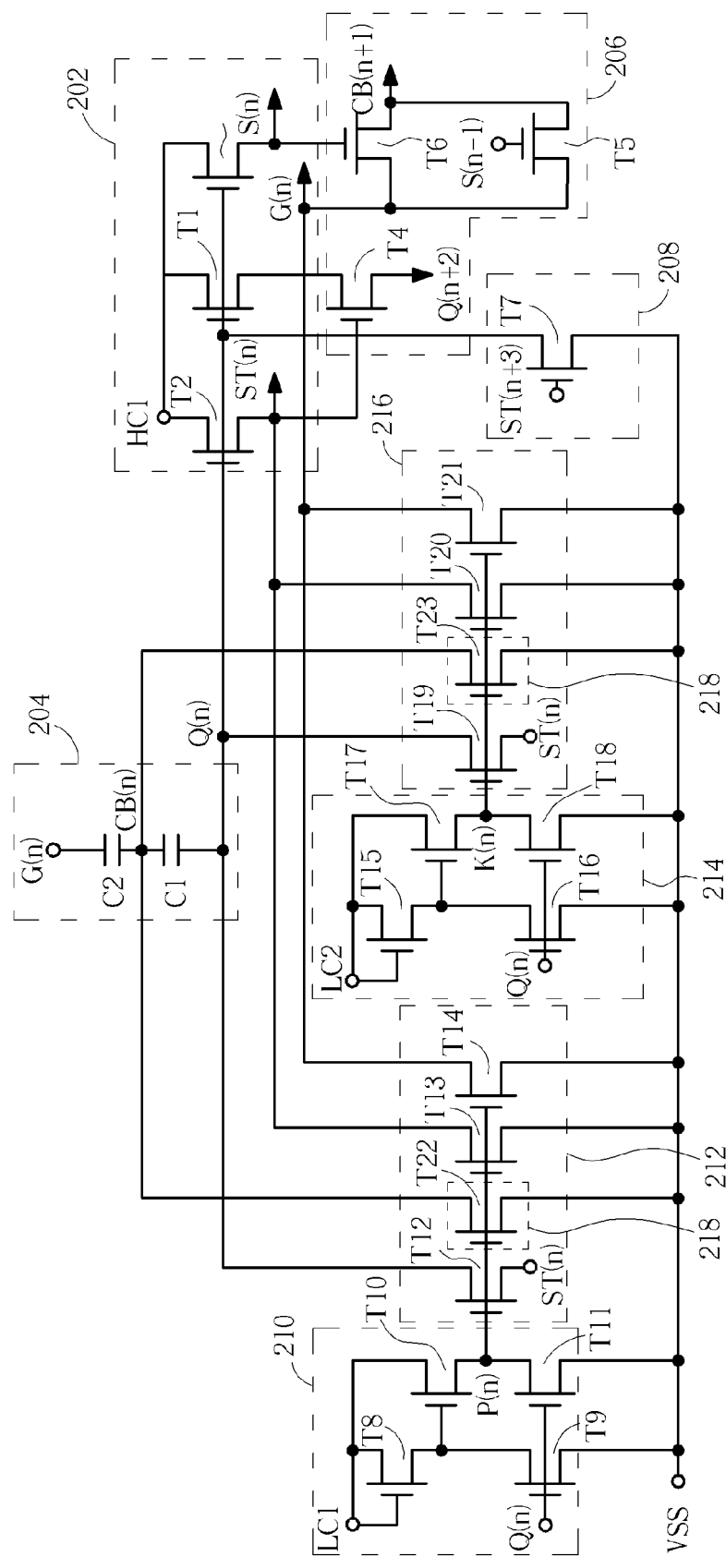
FIG. 5 is a diagram illustrating an Nth shift register circuit according another embodiment of the present disclosure.

Please refer to FIG. 5, which is a diagram illustrating an Nth shift register circuit 500 according another embodiment of the present disclosure. The Nth shift register circuit 500 further includes a stabilizing unit 218 comparing with FIG. 4. The stabilizing unit 218 may include a twenty-second transistor T22, which has a control end coupled to the control end of the twelfth transistor T12, a first end coupled to the first end of the first capacitor C1, and a second end coupled to the second end of the seventh transistor T7. The stabilizing unit 218 may further include a twenty-third transistor T23, which has a control end coupled to the control end of the nineteenth transistor T19, a first end coupled to the first end of the first capacitor C1, and a second end coupled to the second end of the seventh transistor T7. When the first pull down control unit 210 provides the first pull down signal P(n), the twenty-second transistor T22 may pull down the Nth boost signal CB(n) according to the first pull down signal P(n). When the second pull down control unit 214 provides the second pull down signal K(n), the twenty-third transistor T23 may pull down the Nth boost signal CB(n) according to the second pull down signal K(n). Thus the Nth boost signal CB(n) of the Nth shift register circuit 500 may be kept at the low voltage VGL without being interfered by noise from the Nth gate signal G(n) even when the (N−1)th boost control signal S(n−1) in FIG. 3 is at the low voltage VGL. Other parts of the Nth shift register circuit 500 are almost the same to FIG. 4 and the principles of FIG. 3 may be applied to FIG. 5.

Figure 6:
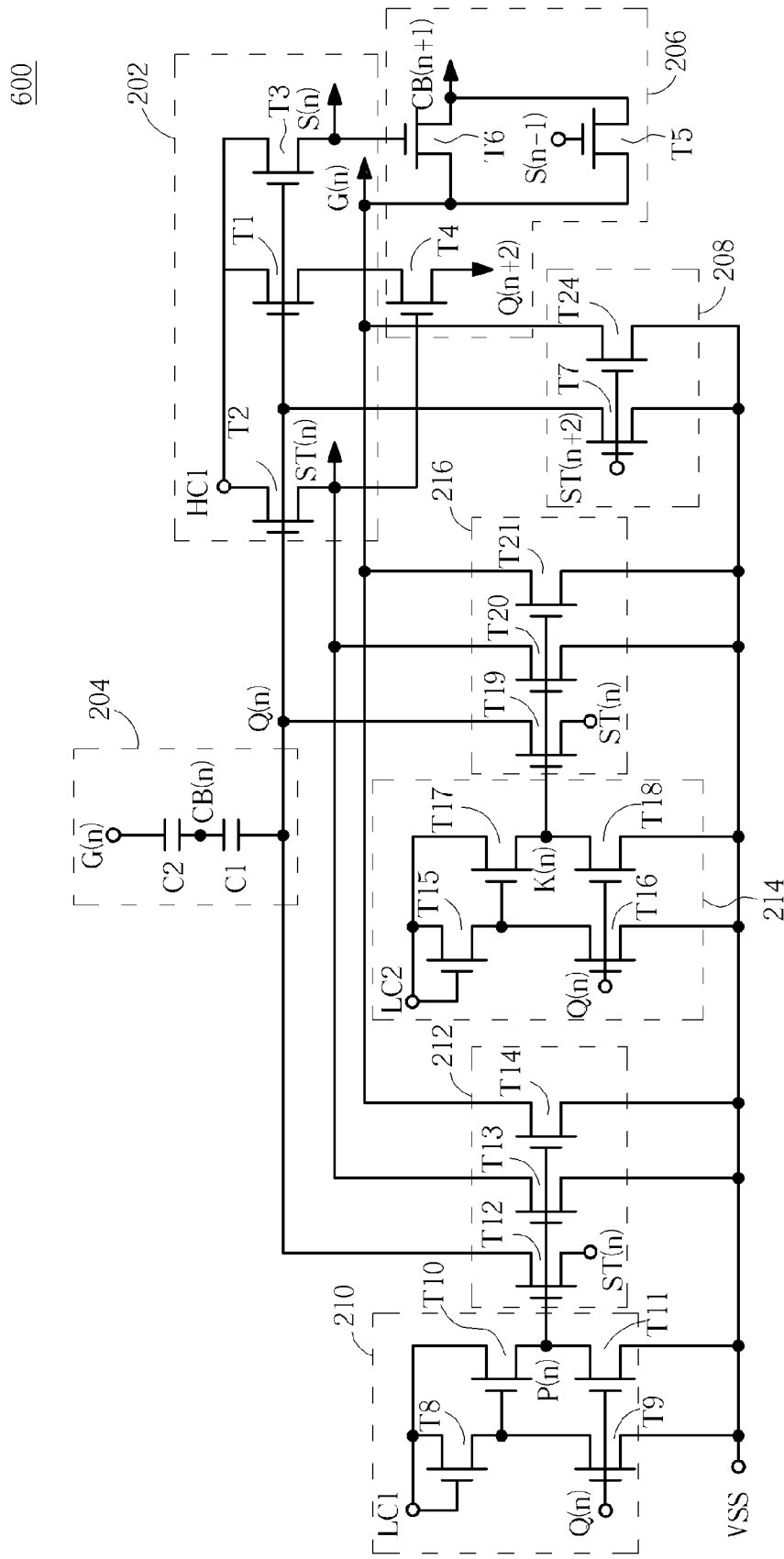
FIG. 6 is a diagram illustrating an Nth shift register circuit according another embodiment of the present disclosure.

Please refer to FIG. 6, which is a diagram illustrating an Nth shift register circuit 600 according another embodiment of the present disclosure. The Nth shift register circuit 600 further includes a twenty-fourth transistor T24 in the key pull down unit 208 of the Nth shift register circuit 400 of FIG. 4. The twenty-fourth transistor T24 has a control end coupled to the control end of the seventh transistor T7, a first end coupled to the second end of the first transistor T1, and a second end coupled to the second end of the seventh transistor T7. The control end of the seventh transistor T7 of the Nth shift register circuit 600 is for receiving an (N+2)th transmission control signal ST(n+2). Other parts of the Nth shift register circuit 500 are identical to FIG. 4.

Figure 7:
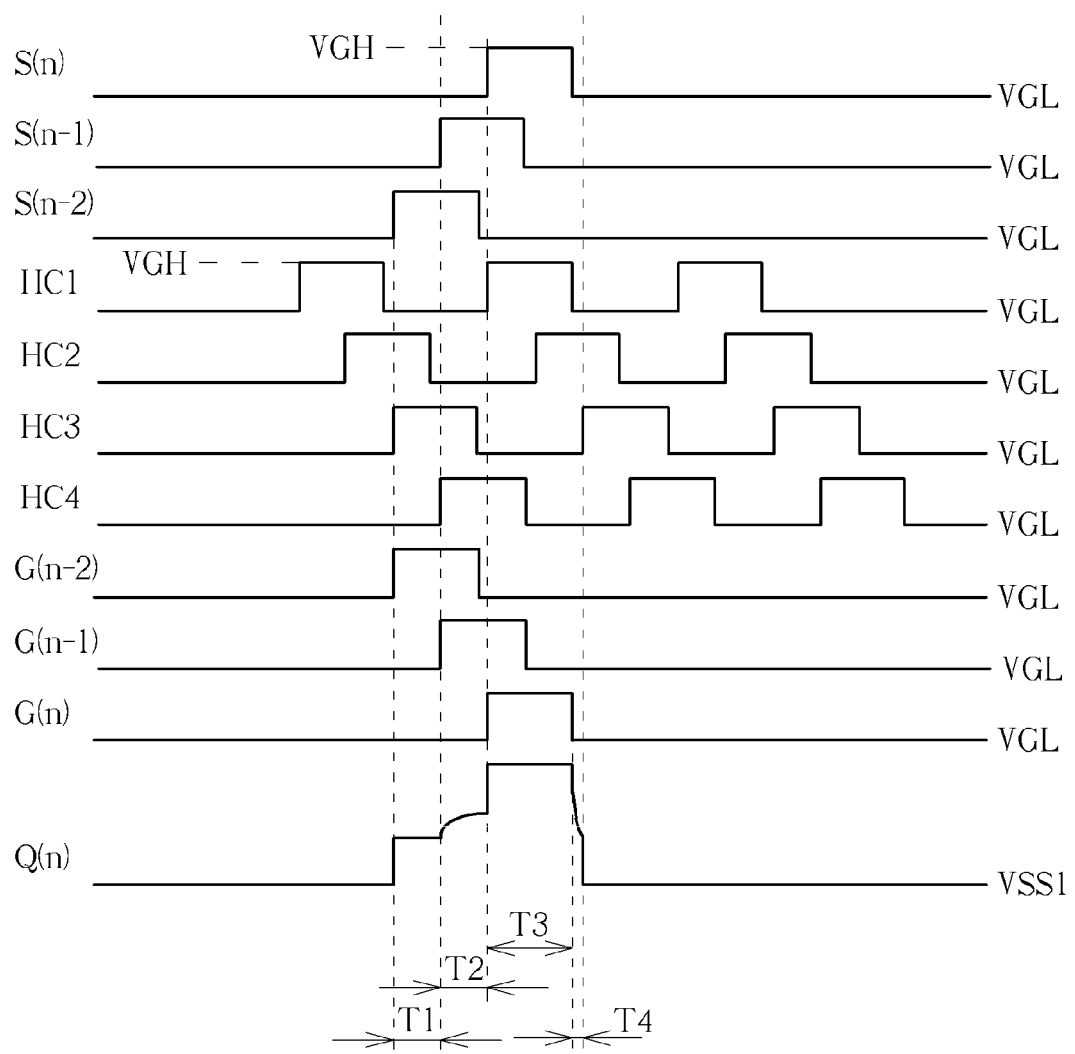
FIG. 7 is a waveform diagram illustrating signals of the Nth shift register circuit of FIG. 6 according to an embodiment of the present disclosure.

FIG. 7 is a waveform diagram illustrating signals of the Nth shift register circuit 600 of FIG. 6 according to an embodiment of the present disclosure. Operations in T1, T2, and T3 periods of FIG. 7 are identical to FIG. 3. A difference between FIG. 6 and FIG. 4 is that the control end of the seventh transistor T7 of the Nth shift register circuit 600 is for receiving the (N+2)th transmission control signal ST(n+2). When T4 period of FIG. 7 ends, the third high frequency clock signal HC3 switches from the low voltage VGL to the high VGH for pulling up the (N+2)th transmission control signal ST(n+2) for conducting the seventh transistor T7 and the twenty-fourth transistor T24 to pull down the Nth driving signal Q(n) to the reference voltage VSS and the Nth gate signal G(n) to the low voltage VGL. Thus the Nth gate signal G(n) is ensured to remain at the low voltage VGL. In contrast, the seventh transistor T7 in FIG. 4 will not pull down the said Nth signals until the (N+3)th transmission control signal ST(n+3) rises to the high voltage VGH. In other words, T4 period in FIG. 7 is shorter than T4 period in FIG. 4.

Embodiments of FIG. 5 and FIG. 6 share the same reference voltage VSS, but the disclosure is not limited thereto, and embodiments of FIG. 5 and FIG. 6 may be applied to other embodiments similar to FIG. 2.

In summary, embodiments of the present disclosure pull up the Nth driving signal three times in a row by pulling up the driving signal to the first voltage V1, then to the second voltage V2, then to the third voltage V3, in order to boost a driving ability of the driving signal to a higher level. Thus the driving ability of the Nth shift register circuit may increase without boosting the high voltage VGH of the Nth gate signal (the scanning signal), thereby achieving better charging rate of pixels, decreasing the dynamic power consumption and the static power consumption of the Nth shift register circuit, and minimizing layout space of the transistors in the Nth shift register circuit.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A shift register comprising a plurality of shift register circuits, an Nth shift register circuit of the shift register comprising:
a driving unit for providing a gate signal, a first boost control signal, and a first transmission control signal according to a first driving signal and a high frequency clock signal;
a boost unit coupled to the driving unit for boosting the first driving signal voltage according to a first boost signal;
a pull up unit coupled to the driving unit for providing a second driving signal according to the first transmission control signal and the gate signal, and for providing a second boost signal according to the first boost control signal and a second boost control signal; and
a key pull down unit coupled to the driving unit for pulling down the first driving signal according to a second transmission control signal.

2. The shift register of claim 1, wherein the Nth shift register circuit further comprises:
a first pull down control unit for providing a first pull down signal according to the first driving signal and a first low frequency clock signal; and
a first pull down unit coupled to the first pull down control unit and the driving unit for pulling down the gate signal, the first transmission control signal, and the first driving signal according to the first pull down signal.

3. The shift register of claim 2, wherein the Nth shift register circuit further comprises:
a second pull down control unit for providing a second pull down signal according to the first driving signal and a second low frequency clock signal; and
a second pull down unit coupled to the second pull down control unit and the driving unit for pulling down the gate signal, the first transmission control signal, and the first driving signal according to the second pull down signal.

4. The shift register of claim 3 wherein the driving unit comprises:
a first transistor having a control end for receiving the first driving signal, a first end for receiving the high frequency clock signal, and a second end for providing the gate signal;
a second transistor having a control end coupled to the control end of the first transistor, a first end coupled to the first end of the first transistor, and a second end for providing the first transmission control signal; and
a third transistor having a control end coupled to the control end of the first transistor, a first end coupled to the first end of the first transistor, and a second end for providing the first boost control signal.

5. The shift register of claim 4 wherein the pull up unit comprises:
a fourth transistor having a control end coupled to the second end of the second transistor, a first end coupled to the second end of the first transistor, and a second end for providing the second driving signal;
a fifth transistor having a control end for receiving the second boost control signal, a first end coupled to the second end of the first transistor, and a second end; and
a sixth transistor having a control end coupled to the second end of the third transistor, a first end coupled to the second end of the first transistor, and a second end coupled to the second end of the fifth transistor for providing the second boost signal.

6. The shift register of claim 5 wherein the second boost control signal is provided by an (N−1)th shift register circuit, and the second boost signal is outputted by the Nth shift register circuit.

7. The shift register of claim 5 wherein the boost unit comprises a first capacitor having a first end for receiving the first boost signal and a second end coupled to the control end of the first transistor.

8. The shift register of claim 7 wherein the boost unit further comprises a second capacitor coupled to the second end of the first transistor and the first end of the first capacitor.

9. The shift register of claim 7 wherein the first boost signal is provided by an (N−1)th shift register circuit.

10. The shift register of claim 9 wherein the key pull down unit comprises:
a seventh transistor having a control end for receiving the second transmission control signal, a first end coupled to the control end of the first transistor, and a second end for receiving a first reference voltage.

11. The shift register of claim 10 wherein the second transmission control signal is provided by an (N+3)th shift register circuit.

12. The shift register of claim 10 wherein the first pull down control unit comprises:
an eighth transistor having a control end for receiving the first low frequency clock signal, a first end coupled to the control end of the eighth transistor, and a second end;
a ninth transistor having a control end for receiving the first driving signal, a first end coupled to the second end of the eighth transistor, and a second end for receiving a second reference voltage;
a tenth transistor having a control end coupled to the second end of the eighth transistor, a first end coupled to the control end of the eighth transistor, and a second end for providing the first pull down signal; and
an eleventh transistor having a control end coupled to the control end of the ninth transistor, a first end coupled to the second end of the tenth transistor, and a second end coupled to the second end of the ninth transistor.

13. The shift register of claim 12 wherein a voltage level of the second reference voltage is substantially equal to that of the first reference voltage.

14. The shift register of claim 12 wherein the first pull down unit comprises:
a twelfth transistor having a control end coupled to the second end of the tenth transistor, a first end coupled to the control end of the second transistor, and a second end coupled to the second end of the second transistor;
a thirteenth transistor having a control end coupled to the control end of the twelfth transistor, a first end coupled to the second end of the second transistor, and a second end coupled to the second end of the ninth transistor; and
a fourteenth transistor having a control end coupled to the control end of the twelfth transistor, a first end coupled to the second end of the first transistor, and a second end coupled to the second end of the seventh transistor.

15. The shift register of claim 14 wherein the second pull down control unit comprises:
a fifteenth transistor having a control end for receiving the second low frequency clock signal, a first end coupled to the control end of the fifteenth transistor, and a second end;
a sixteenth transistor having a control end for receiving the first driving signal, a first end coupled to the second end of the fifteenth transistor, and a second end coupled to the second end of the ninth transistor;
a seventeenth transistor having a control end coupled to the second end of the fifteenth transistor, a first end coupled to the control end of the fifteenth transistor, and a second end for providing the second pull down signal; and
an eighteenth transistor having a control end coupled to the control end of the sixteenth transistor, a first end coupled to the second end of the seventeenth transistor, and a second end coupled to the second end of the sixteenth transistor.

16. The shift register of claim 15 wherein the second pull down unit comprises:
a nineteenth transistor having a control end coupled to the second end of the seventeenth transistor, a first end coupled to the control end of the second transistor, and a second end coupled to the second end of the second transistor;
a twentieth transistor having a control end coupled to the control end of the nineteenth transistor, a first end coupled to the second end of the second transistor, and a second end coupled to the second end of the sixteenth transistor; and
a twenty-first transistor having a control end coupled to the control end of the nineteenth transistor, a first end coupled to the second end of the first transistor, and a second end coupled to the second end of the seventh transistor.

17. The shift register of claim 16 further comprising:
a stabilizing unit coupled to the boost unit for pulling down the first boost signal according to the first pull down signal or the second pull down signal.

18. The shift register of claim 17 wherein the stabilizing unit comprises:
a twenty-second transistor having a control end coupled to the control end of the twelfth transistor, a first end coupled to the first end of the first capacitor, and a second end coupled to the second end of the seventh transistor.

19. The shift register of claim 18 wherein the stabilizing unit further comprises:
a twenty-third transistor having a control end coupled to the control end of the nineteenth transistor, a first end coupled to the first end of the first capacitor, and a second end coupled to the second end of the seventh transistor.

20. The shift register of claim 10 wherein the key pull down unit further comprises:
a twenty-fourth transistor having a control end coupled to the control end of the seventh transistor, a first end coupled to the second end of the first transistor, and a second end coupled to the second end of the seventh transistor.

21. The shift register of claim 20 wherein the second transmission control signal is provided by an (N+2)th shift register circuit.

* * * * *